United States Patent
Zhang et al.

(10) Patent No.: US 9,530,248 B2
(45) Date of Patent: Dec. 27, 2016

(54) MODEL-BASED HELMET DESIGN TO REDUCE CONCUSSIONS

(75) Inventors: Liying Zhang, Troy, MI (US); King Hay Yang, West Bloomfield, MI (US); Albert I King, Bloomfield Hills, MI (US)

(73) Assignee: Wayne State University, Detroit, MI (US)

( * ) Notice: Subject to any disclaimer, the term of this patent is extended or adjusted under 35 U.S.C. 154(b) by 733 days.

(21) Appl. No.: 13/990,521

(22) PCT Filed: Dec. 7, 2011

(86) PCT No.: PCT/US2011/063701
§ 371 (c)(1),
(2), (4) Date: Nov. 7, 2013

(87) PCT Pub. No.: WO2012/078730
PCT Pub. Date: Jun. 14, 2012

(65) Prior Publication Data
US 2014/0081601 A1    Mar. 20, 2014

Related U.S. Application Data

(60) Provisional application No. 61/420,432, filed on Dec. 7, 2010.

(51) Int. Cl.
*G06F 17/50*   (2006.01)
*G06T 17/20*   (2006.01)
*A42C 2/00*    (2006.01)

(52) U.S. Cl.
CPC .............. *G06T 17/20* (2013.01); *A42C 2/00* (2013.01); *G06F 17/50* (2013.01); *G06F 17/5018* (2013.01)

(58) Field of Classification Search
CPC ...... G06T 17/20; G06F 17/50; G06F 17/5018; A42C 2/00
USPC ............................................................ 703/1
See application file for complete search history.

(56) References Cited

U.S. PATENT DOCUMENTS

| | | | |
|---|---|---|---|
| 5,963,989 A | 10/1999 | Robertson | |
| 6,726,623 B2 | 4/2004 | Ziejewski | |
| 6,868,560 B2 | 3/2005 | Bostock | |
| 2004/0064295 A1 | 4/2004 | Zhang | |

(Continued)

OTHER PUBLICATIONS

Afshari, A.; Rajaai S. M. "Finite Element Simulations Investigating the Role of the Helmet in Reducing Head Injuries" ISSN 1726-4529; 2008; pp. 42-51.*

(Continued)

*Primary Examiner* — Dwin M Craig
(74) *Attorney, Agent, or Firm* — Brooks Kushman P.C.

(57) ABSTRACT

A system and method for designing a helmet to reduce mild traumatic brain injury sustained by a user during primary or secondary head impact include modeling a helmeted head including a head, brain, and helmet using a finite element computer model, the finite element computer model including material properties for the head, brain structures, and helmet and estimating at least intracranial pressure, brain strain and strain rate in response to an impact; and selecting at least one of a helmet cushion material and helmet shell material to limit at least one of intracranial pressure, brain strain and strain rate to a corresponding threshold for an associated impact.

19 Claims, 21 Drawing Sheets

(56) References Cited

U.S. PATENT DOCUMENTS

2005/0165327 A1* 7/2005 Thibault .............. A61B 3/0066
600/558
2007/0027667 A1 2/2007 Osborn
2007/0119538 A1* 5/2007 Price ........................ A42B 3/06
156/242

OTHER PUBLICATIONS

Gao Chunping, "Finite Element Modeling of Human Brain and Application in Neurosurgical Procedures" 2007, University of Singapore, 189 pages.*
International Preliminary Report and Written Opinion dated Mar. 4, 2014, International Application No. PCT/US2011/063701, filed Dec. 7, 2010.
International Search Report and Written Opinion mailed Mar. 29, 2012, for corresponding PCT Application PCT/US2011/063701 filed Dec. 7, 2011.

* cited by examiner

MODEL-BASED HELMET DESIGN TO REDUCE CONCUSSIONS

CROSS REFERENCE TO RELATED APPLICATIONS

This application is the U.S. national phase of PCT/US2011/063701 filed Dec. 7, 2011, which claims the benefit of U.S. Provisional Application No. 61/420,432 filed Dec. 7, 2010, the disclosures of which are hereby incorporated by reference in their entirety.

TECHNICAL FIELD

The present disclosure relates to a helmet and associated design methodology to reduce concussions or mild traumatic brain injury associated with head impacts.

BACKGROUND

It has been reported that over 4 million concussions occur in sport and recreational activities. Studies of professional football players in the United States National Football League (NFL) indicate that approximately 150 players or 1 player in every 2-3 games are diagnosed with a mild traumatic brain injury (MTBI) also referred to as a mild concussion. A study of over 1,000 former NFL players found that 60% had sustained at least one concussion and 26% had sustained three or more concussions in their career. Another study of retired NFL players suggested that 20% of players that sustained a concussion subsequently suffered from depression, which is three times the rate of depression in players who have not sustained a concussion. The risks of long-term cognitive deficit and cumulative effects of multiple concussions highlight the need for improvements in helmet design.

While various types of protective headgear have been developed to reduce injuries to the brain, skull, and neck resulting from head impacts using a hard outer shell in combination with internal padding made of an energy-absorbing material, conventional helmet designs are generally based on reducing injuries associated with linear (translational) acceleration due to impacts. Conventional designs having internal padding secured to the outer shell by chemical fasteners, such as adhesives, or by mechanical fasteners, such as hook and loop closures, or similar structures, for example, may not adequately protect users from various types of traumatic brain injury (TBI), which may include diffuse brain injury (DBI) that forms a broad spectrum of injuries ranging from mild concussion without loss of consciousness, to classical cerebral concussion with transient disturbance of consciousness, to diffuse axonal injury (DAI) with prolonged loss of consciousness of varying duration and subdural hematoma. TBI may result from impacts with another player, an object, or the ground, for example. While these types of injuries have been recognized in the prior art, there is disagreement with respect to the injury mechanism and therefore with respect to methods for mitigating these types of injuries using an appropriate helmet. Likewise, prior art helmet design and testing based primarily on linear (translational) acceleration as a predictor of injury resulting from an impact may be less reliable than more recently developed indicators.

SUMMARY

A system and method for designing a helmet to reduce mild traumatic brain injury sustained by a user during primary or secondary head impact include modeling a head, brain, and helmet using a finite element (FE) computer model, the finite element computer model including material properties for the head, brain and helmet and estimating at least brain strain and strain rate in response to an impact; and selecting at least one of a helmet cushion material and helmet shell material to limit at least one of the brain strain and strain rate to a corresponding threshold for an associated impact.

In one embodiment, a helmet is designed using the finite element computer model with injury criteria based on intracranial pressure, brain strain and brain strain rate, which may include the product of brain strain and brain strain rate rather than head input parameters, such as translational acceleration, to determine helmet shell and helmet cushion material properties in addition to cushion thickness. Various embodiments use strain and strain rate due to both linear and angular acceleration provided by the finite element computer model to tune the helmet shell and padding (cushion) to reduce the brain pressure and strain experienced by the brain during impact.

Various embodiments according to the disclosure may include selecting a corresponding threshold for intracranial pressure, brain strain and/or brain strain rate by identifying intracranial pressure, brain strain and/or brain strain rate using the model for selected impact characteristics that would result in a mild traumatic brain injury to the user. Methods for designing a helmet according to the present disclosure may also include determining probability or extent of brain injury based on computed intracranial pressure, brain strains and brain strain rates at a plurality of locations and/or structures of the finite element brain model. In addition, the method may include assigning a risk of concussion based on the computed intracranial pressures, brain strains and brain strain rates. The intracranial pressure, brain strain and strain rates may include both linear and angular calculations to provide a more accurate prediction of TBI for particular impact conditions. Likewise, various embodiments according to the present disclosure may include determining or computing head linear and angular accelerations associated with the computed intracranial pressures, brain strains and brain strain rates for use in selecting or evaluating helmet shell and/or cushion material.

Embodiments according to the present disclosure may include selecting a helmet cushion material having a stiffness exhibiting a non-linear response to reduce the possibility of a user's head from bottoming out against the helmet shell in response to an impact having a designated characteristic. The method may also include selecting a helmet cushion material or material properties that reduce angular acceleration of the brain during impact. Various embodiments may also include determining measurable input parameters, such as translation and/or rotational acceleration for testing of helmets based on the finite element computer model of the head and brain and associated intracranial pressure, brain strain and brain strain rate.

A system for designing a helmet to reduce traumatic brain injury sustained by a user during primary or secondary head impact according to various embodiments of the present disclosure includes a computer having a processor and a persistent storage medium in communication with the computer and having a finite element computer model executable by the computer to predict mild traumatic brain injury associated with a designated head impact of a user wearing a helmet, the finite element model representing a head, brain, and the helmet with each having associated material properties. The finite element model estimates at least one of intracranial pressure, brain strain and strain rate for at least one brain structure in response to the primary or secondary head impact. The system may also include code for determining testing parameter values, such as angular acceleration and translational acceleration, for example, associated with at least one of the intracranial pressure, brain strain and strain rate.

The present disclosure describes a new device designed to reduce the likelihood of a cerebral concussion of the wearer of a helmet, such as a football helmet, during blunt impact with another helmet or with the ground, for example.

The present disclosure provides a system and method with various advantages. For example, the present disclosure is an improvement over previous designs because it is designed to prevent concussion while existing helmets and associated development strategies were designed to prevent skull fracture. According to various embodiments of the present disclosure, the helmet shell and padding or cushion material are tuned using a finite element (FE) computer model of the head, brain, and helmet to reduce one or more concussion indicators, such as intracranial pressure, strain and/or strain rate experienced by the brain, during a particular impact. The present disclosure recognizes that localized pressure, strain and strain rate in the brain is a more accurate predictor of clinical signs/symptoms of concussions and other TBI and uses these parameters as calculated or predicted by the finite element computer model to select and tune the helmet design for a particular application. In one embodiment, the computer model is the Wayne State University Head Injury Model (WSUHIM) developed by Zhang et al (2001) and available from Wayne State University of Detroit, Mich., which is extremely detailed and has been validated against available experimental data. The design criteria are selected to limit one or more TBI predictors, which may include intracranial pressure, strain and strain rate experienced by one or more structures of the brain, below corresponding thresholds that are likely to result in a specified injury.

The present disclosure also recognizes that wearing a conventional helmet does not change rotational acceleration appreciably, but does reduce translational acceleration significantly. As such, the present disclosure recognizes various other injury criteria that are better predictors of TBI and uses at least one of the indicators to evaluate helmets, predict probability of TBI, and to select and tune helmet shell and cushion material properties to reduce probability of a specified TBI for a particular type and speed of impact.

As those of ordinary skill in the art will appreciate, helmet design according to the present disclosure has the potential to improve upon the safety of current helmets relative to preventing TBI, and in particular mild TBI (MTBI) or concussion, and may have a significant impact in reducing such injury in professional, collegiate, high school and recreational sports, particularly football. The design approach according to various embodiments of the present disclosure has broad applications that can be adapted to virtually any kind of helmet subject to impact, such as helmets used by ice hockey players, motorcyclists, bicycle riders, scooter riders, and horseback riders, for example. In addition, the information provided by a computer-implemented finite element model in a helmet design process according to the present disclosure may be used as the basis for developing standard test methods and injury criteria for future helmet testing. Helmets designed using a computer-implemented model according to embodiments of the present disclosure may provide equal protection to the brain from omnidirectional impacts to reduce the probability of injury resulting from any conceivable impact encountered in game play.

The above advantages and other advantages and features will be readily apparent from the following detailed description of the preferred embodiments when taken in connection with the accompanying drawings.

DETAILED DESCRIPTION OF THE PREFERRED EMBODIMENT(S)

As those of ordinary skill in the art will understand, various features of the embodiments illustrated and described with reference to any one of the Figures, may be combined with features illustrated in one or more other embodiments to produce embodiments having combinations of features that are not explicitly illustrated or described together. The combinations of features illustrated provide representative embodiments for typical applications. However, various combinations and modifications of the features consistent with the teachings of the present disclosure may be desired for particular applications or implementations. The representative embodiments used in the illustrations relate generally to protective headgear for various types of competitive and recreational applications where single or multiple impacts may occur such as football, as well as motorcycle, scooter, bicycle, and horseback riding, for example. However, the teachings of the present disclosure may also be used in other applications. Those of ordinary skill in the art may recognize similar applications or implementations.

Reference will now be made to embodiments of the present disclosure, which include the best mode of practicing the invention presently contemplated by the inventors. The Figures are not necessarily to scale. However, it is to be understood that the disclosed embodiments are merely exemplary and that various other embodiments are within the scope of the disclosure. Therefore, specific details disclosed herein are not to be interpreted as limiting, but merely as a representative basis for any aspect of the disclosure and/or as a representative basis for teaching one skilled in the art to variously employ the teachings herein. Furthermore, the terminology used herein is used only for the purpose of describing particular embodiments of the present invention and is not intended to be limiting in any way.

Figure 1:
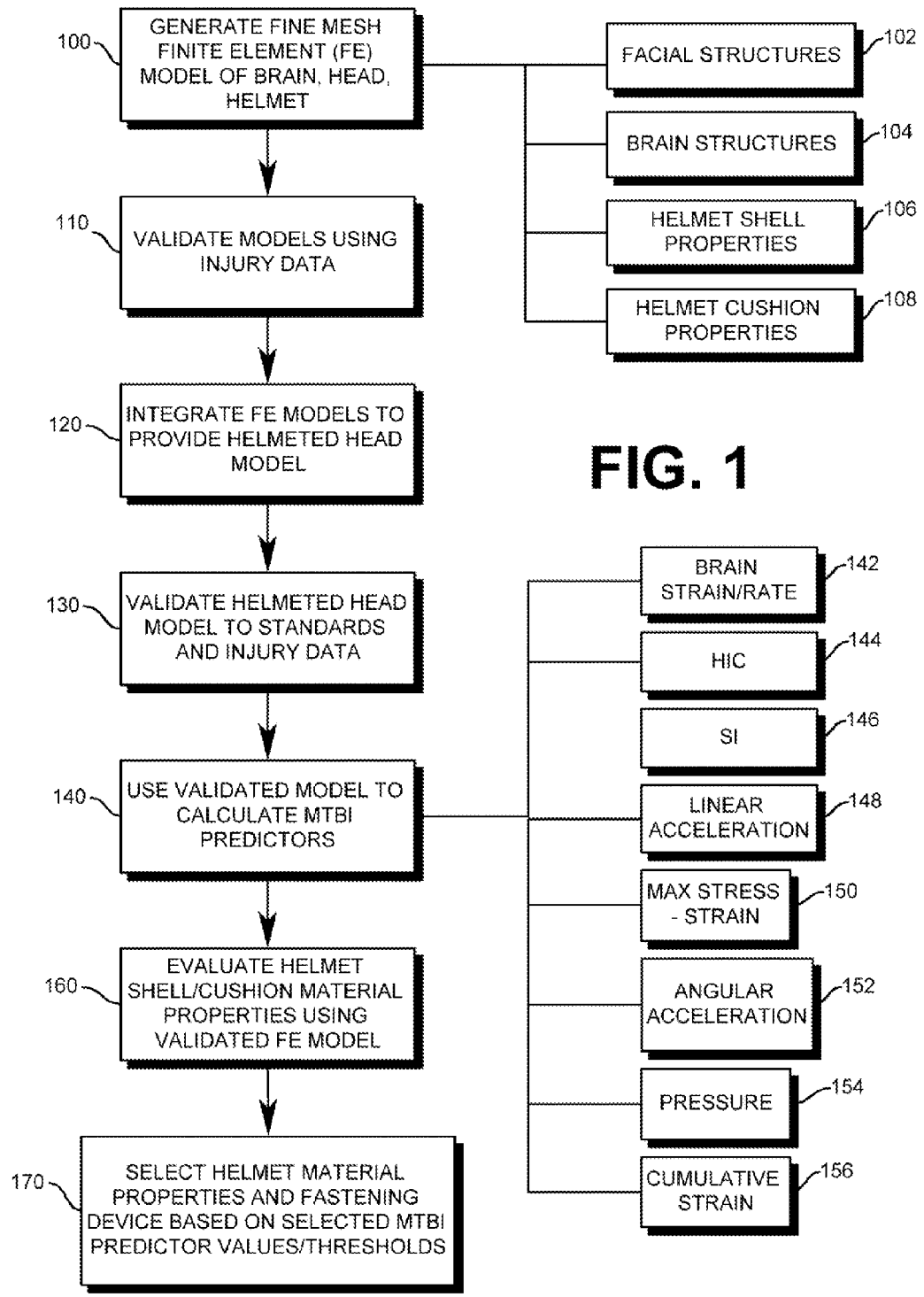
FIG. 1 is a flowchart illustrating operation of a system or method for designing a helmet using a finite element model of a helmeted head according to various embodiments of the present disclosure.
Figure 2:
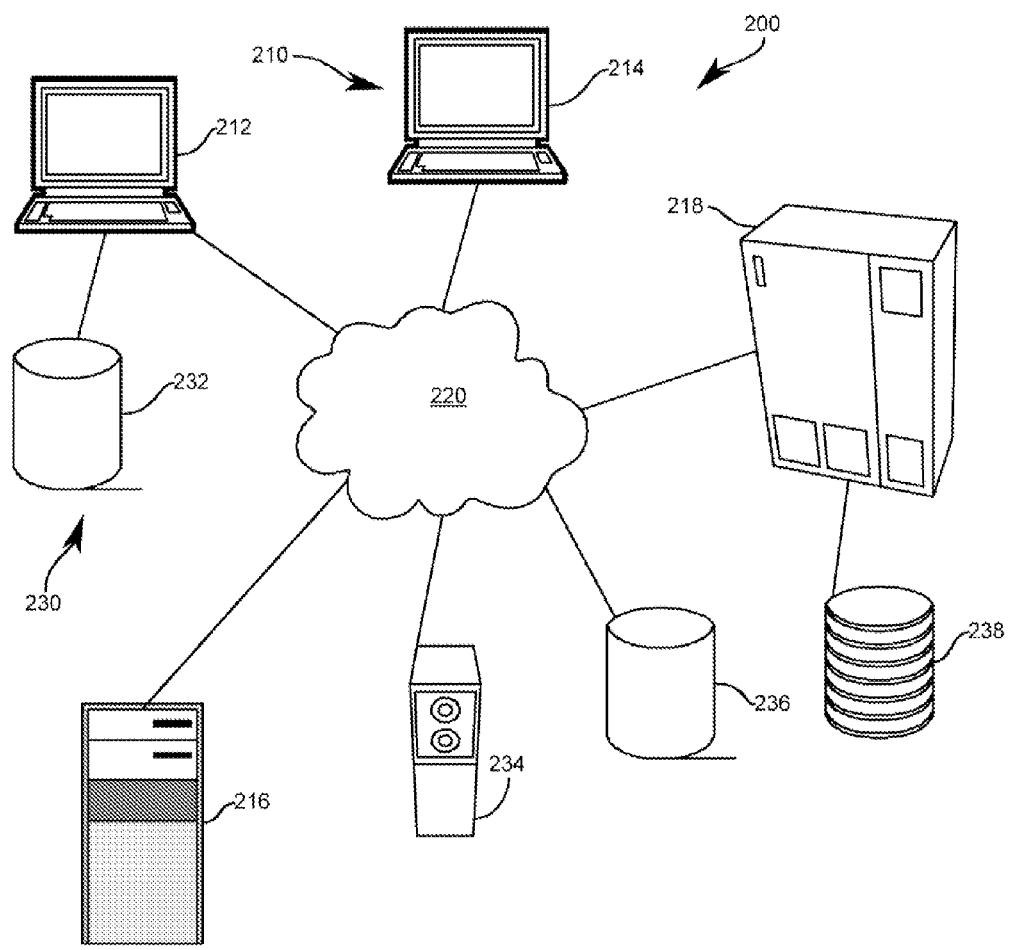
FIG. 2 is a block diagram illustrating a system or method for designing a helmet using a finite element model of a helmeted head according to various embodiments of the present disclosure.

Referring now to FIG. 1 a flowchart illustrating operation of a system or method for designing a helmet using a fine mesh finite element model of a helmeted head according to various embodiments of the present disclosure is shown. Those of ordinary skill in the art will understand that the operation illustrated in FIG. 1 is a computer-implemented method performed by a programmed computer having data and instructions representing a fine mesh finite element model of a helmeted head stored in a persistent magnetic, optical, or combination computer readable storage medium, such as a disk drive, for example. A representative computer system having a processor or CPU in communication with one or more computer readable storage media for implementing a system or method according to various embodiments of the present disclosure is shown in FIG. 2.

Figure 3:
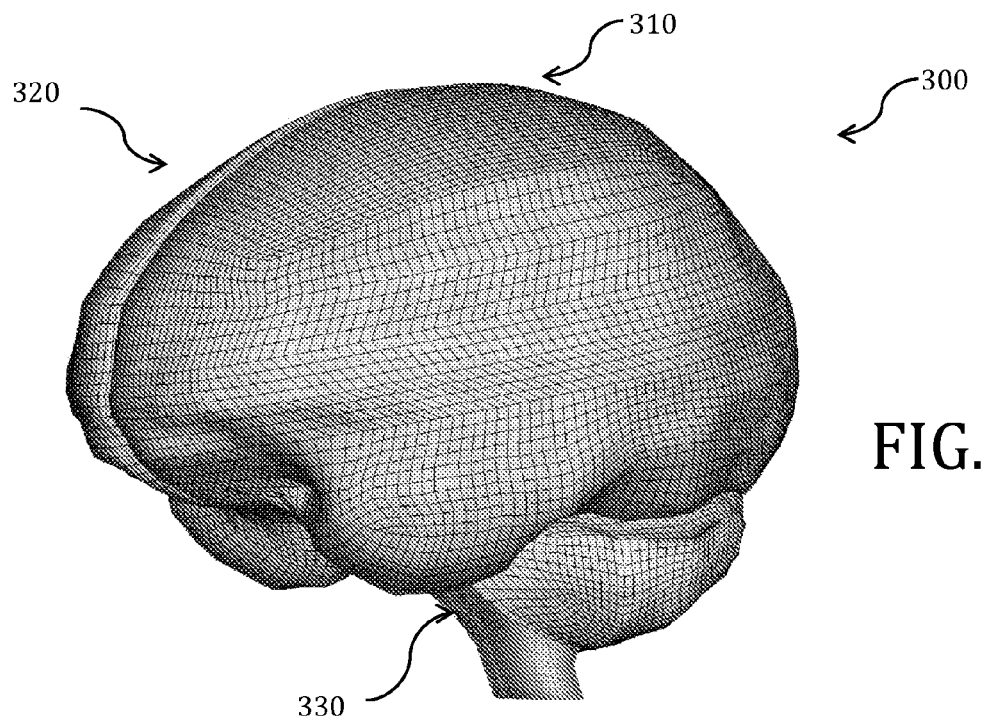
FIGS. 3-5 illustrate a representative fine mesh FE model of the brain including various brain structures for use in calculating one or more MTBI predictors that may be used in designing a helmet to reduce concussions according to various embodiments of the present disclosure.
Figure 4:
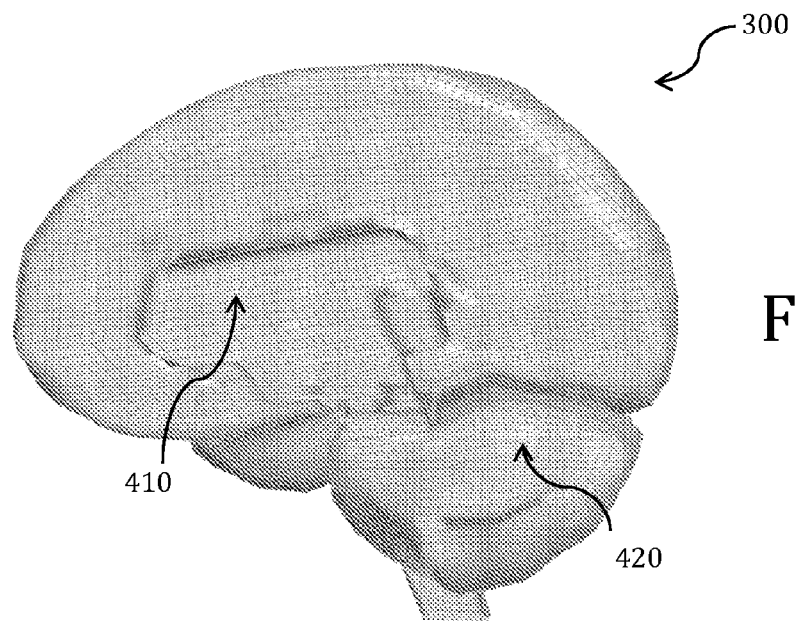

As generally represented by block 100 of FIG. 1, a fine mesh finite element model of the brain, head, and a helmet is generated. A representative computer-implemented finite element model that can be used to model the head according to one embodiment of the present disclosure is described by Zhang, L, Yang, K H, Dwarampudi, R, Omori, K, Li, T, Chang, K, Hardy, W N, Khalil, T B, King, A I (2001) Recent advances in brain injury research: A new human head model development and validation. Stapp Car Crash J., 45:369-394, the disclosure of which is incorporated herein in its entirety. An updated version of the model that integrates a helmet with a shell and padding has recently been developed and is available for licensing from Wayne State University in Detroit, Mich. The high resolution FE model of the head according to this embodiment features fine anatomical details of various structures of the head including facial structures 102 and brain structures 104. Facial structures 102 may include facial bones, nasal cartilage, temporal mandibular joint, ligaments, soft tissue and skin, for example. Head and brain structures 104 may include the scalp, skull with an outer table, diploe, and inner table, dura, falx, cerebri tentorium, pia, sagittal sinus, transverse sinus, cerebral spinal fluid (CSF), hemispheres of the cerebrum with distinct white and gray matter, cerebral cortex, corpus callosum, cerebellum, midbrain/brainstem, thalamus, lateral ventricles, third ventricles, and bridging veins. The model may also include eyes as illustrated in FIGS. 3 and 4. The entire head model is made up of over 315,000 elements and uses 15 different material properties for various structures and tissues of the head.

While the WSUHIM computer-implemented FE model has been validated using a variety of existing data, various other FE models may be used to calculate a TBI indicator for use in designing a helmet to reduce probability of a specific TBI for a specified impact or loading condition according to the present disclosure. In various embodiments, the FE model includes a high resolution fine mesh capable of calculating at least tissue level properties of a plurality of brain structures subjected to a specified impact or loading conditions.

In the two football helmet FE models that have been developed, validated and integrated with the head model, the helmet shell properties 106 and helmet cushion properties 108 were meshed. The protective liners or cushions for frontal, side, crown, and rear regions were meshed. The thicknesses of the energy absorbing liners, padding, or cushions at the crown were separately meshed to incorporate various thickness and material definitions as described in greater detail herein.

The individual FE models of the head, including the face and various brain structures, are validated using available injury data as generally represented by block 110. The WSUHIM described above has been subjected to rigorous validation against available cadaveric intracranial and ventricular pressure data, relative displacement data between the brain and the skull, and facial impact data. Similar validation using available data for a helmet FE model is also performed. The individual models are integrated to provide a helmeted head model as represented at block 120. The integrated helmeted head model is validated relative to standard drop tests and associated injury data as generally represented by block 130 and as illustrated and described in greater detail with reference to FIG. 8.

With continuing reference to FIG. 1, the validated helmeted head model is used to calculate at least one TBI indicator as generally represented by block 140. Any of a variety of TBI indicators may be selected to predict probability of a particular type of TBI for a particular type of impact or loading. TBI indicators may include localized intracranial pressure 154, brain strain, strain rate, or the product of strain and strain rate as represented by block 142.

Other TBI indicators or predictors may include Head Injury Criterion (HIC) 144, Severity Index (SI) 146, linear (translational) acceleration 148, maximum stress and/or maximum strain 150, angular acceleration 152, or cumulative strain 156, for example. In one embodiment, the product of strain and strain rate 142 is selected as a primary or principal predictor of mild TBI or mild concussion for selecting and evaluating helmet shell and cushion material properties using the validated helmeted head FE model as represented by block 160. In various embodiments, the computer-implemented FE model of a helmeted head is used to select helmet cushion or padding material, helmet shell material, and/or various other helmet characteristics as generally indicated at 170. This may include determining helmet geometry, helmet fastening systems, face cage, padding retention strategy, etc. to reduce various parameters associated with injury causing impacts, such as generally described for instrumented headform tests in King, A I; Yang, K H; Zhang, L; Viano, D C (2003) "Is head injury caused by linear or angular acceleration?" Keynote Lecture, Proc. 2003 International IRCOBI Conference on the Biomechanics of Impact, Lisbon, Portugal, the disclosure of which is hereby incorporated by reference.

In one embodiment, a method for designing a helmet includes selecting a number of combinations of shell and padding material for the helmet, beginning with commercially available helmet combinations. The process or method may continue with evaluating currently available materials that are not presently used in helmet design as well as identifying material properties that may not be currently available, but are predicted to be suitable for use in a particular helmet application. For each combination, the integrated helmeted head FE model is used to simulate a large number of impacts at different locations and under different loading conditions to determine associated TBI indicators or predictors and generate a probability of injury for each combination of design materials/parameters. For sports applications, impact speeds that have been shown to result in MTBI may be used. For example, impact speeds of greater than 7 m/s. Various impact locations and directions are simulated to calculate values for at least one TBI indicator, such as the product of brain strain and strain rate, for example. The resulting values are used to determine the predicted extent of brain injury. The computed intracranial pressures, strains and strain rates may be provided to various specialists, such as neurologists, to ascertain the risk of concussion or other TBI. In addition to brain response indicators or parameters, input parameters, such as linear and angular accelerations may be determined for subsequent multivariate analysis.

Various helmet design criteria may be used for evaluation and determining the best design for a particular application. For example, the best helmet design may be determined by the combination of materials that the integrated FE model determines produces the lowest product of strain and strain rate throughout the brain and/or within key brain structures from any impact direction and location. Changes in padding stiffness relative to currently available helmets are anticipated, and may include padding material or construction having a nonlinear response to prevent the head from bottoming out against the shell in more severe impacts.

FIG. 2 is a block diagram illustrating operation of a system or method for designing a helmet using a high-definition, fine mesh finite element model of a helmeted head according to various embodiments of the present disclosure. System 200 includes one or more computers 210, which may include stand-alone computers 212 having an integrated processor and associated local persistent computer readable storage device 232, and/or a computer terminal 214 in communication with an associated processor or CPU 216 via a local and/or wide area computer network generally represented at 220. Processing of the integrated helmeted head FE model may be performed by a single computer with multiple processors, or may be distributed among several computers/processors.

Depending on the particular application and implementation, computers 210 may include general purpose or special purpose processors, such as a RISC processor for example, particularly suited for FE modeling according to various embodiments of the present disclosure. Similarly, computers 210 may be implemented by a mainframe computer 218, mini-computer, server-class computer, etc. with suitable memory and a persistent storage medium 230 in communication with the computer. Persistent storage media may include a magnetic and/or optical tape drive 234, magnetic or optical disk drive 236 or any mass storage device generally represented at 238 capable of storing data and instructions executable by a processor of the computer to calculate at least one injury predictor or indicator associated with a designated head impact of a user wearing a helmet. In various embodiments, the helmeted head FE model is represented by data and instructions or code executed by a computer to simulate or calculate a head, brain, and helmet with each having associated material properties. In one embodiment, system 200 estimates at least one of intracranial pressure, brain strain and strain rate in response to the designated head impact or loading conditions. Various embodiments calculate the localized product of brain strain and strain rate (strain as a function of time) over the impact event to determine a corresponding probability of a designated TBI associated with the specified impact or loading conditions.

Figure 5:
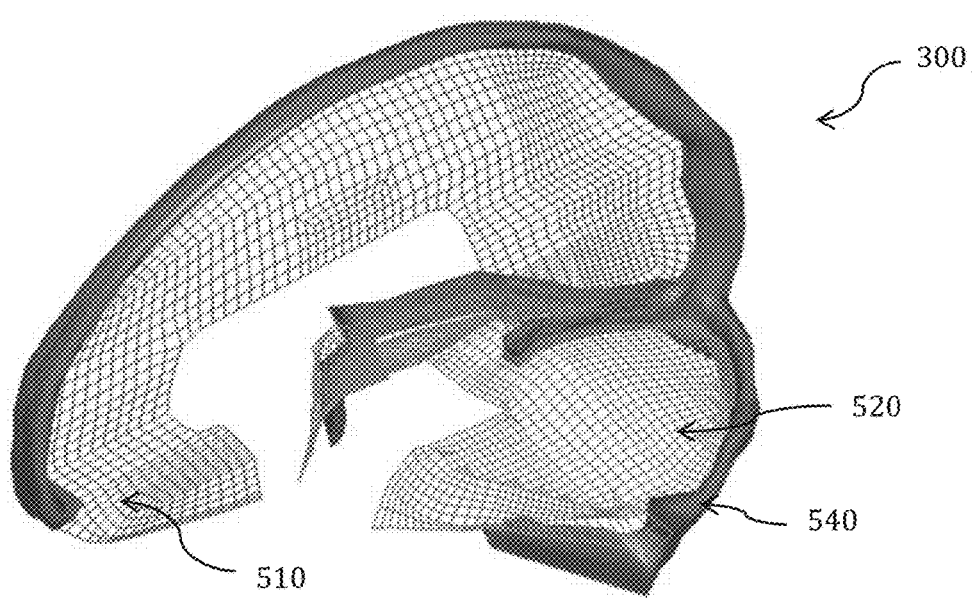

FIGS. 3-5 illustrate a representative fine mesh FE model of the brain including various brain structures for use in calculating one or more TBI predictors that may be used in designing a helmet to reduce concussions according to various embodiments of the present disclosure. As previously described, a high resolution FE model of the head according to various embodiments of the present disclosure includes fine anatomical details of various structures of the brain 300. For example, brain structures may include the cerebral cortex 310, left and right hemispheres 320, midbrain/brainstem 330, corpus callosum 410, and cerebellum 420, for example. Other brain structures may include falx 510, cerebri tentorium 520, pia, sagittal sinus 530, transverse sinus 540, cerebral spinal fluid (CSF), distinct white and gray matter, thalamus, lateral ventricles, third ventricles, and bridging veins, for example.

Figure 6:
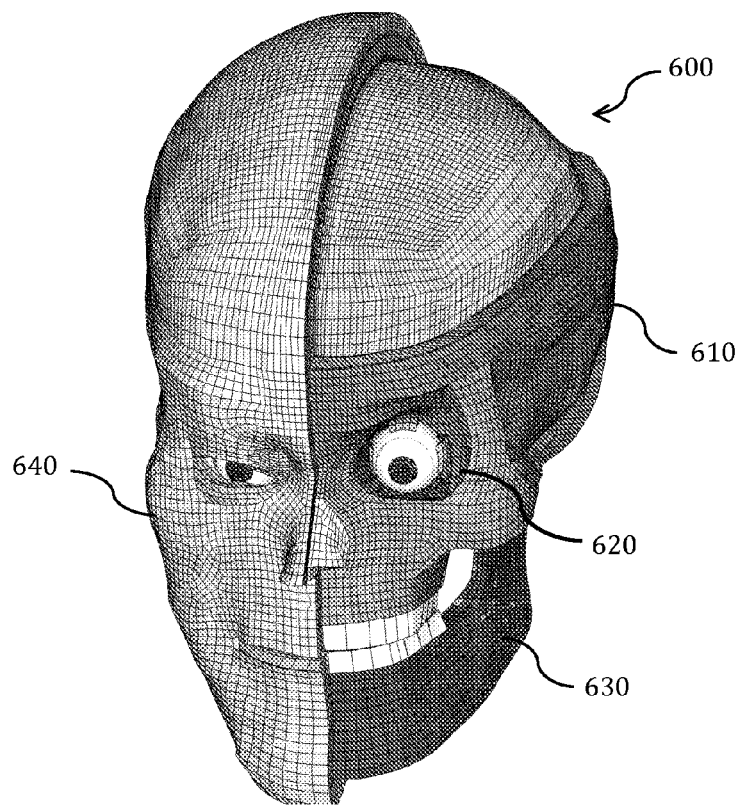
FIG. 6 illustrates a representative fine mesh FE model of the head including over 350,000 elements for the cranium, face, and eyes and integrating a brain model as represented in FIGS. 3-4 for calculating one or more MTBI predictors according to various embodiments of the present disclosure.

FIG. 6 illustrates a representative fine mesh FE model of the head and brain 600 including over 350,000 elements for the cranium 610, facial bone 630, eyes 620, and face 640, and integrating a brain model 300 as represented in FIGS. 3-5 for calculating one or more TBI predictors according to various embodiments of the present disclosure.

Figure 7:
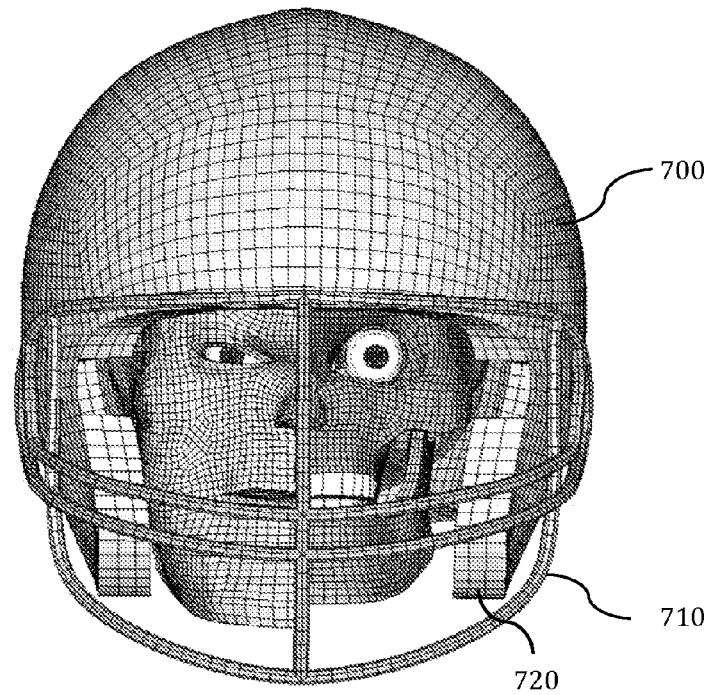
FIG. 7 illustrates a representative fine mesh FE model of a helmeted head for use in calculating one or more MTBI predictors to select or evaluate helmet shell and padding material and construction according to various embodiments of the present disclosure.

FIG. 7 illustrates a representative fine mesh FE model of a helmeted head for use in calculating one or more TBI predictors to select or evaluate helmet shell and padding material and various helmet features according to various embodiments of the present disclosure. In one embodiment, helmet shell 700, face mask 710, and padding or cushion 720 is meshed and modeled. Padding or cushion 720 may include one or more layers and may include separate materials for pads disposed at different positions within shell 700 to tune the overall helmet design for particular impacts based on the TBI indicator values calculated or determined by the FE model. The FE model of helmet 700 is integrated with head model 600 and brain model 300 for use in analyzing brain response to various impact conditions as described herein.

Figure 8:
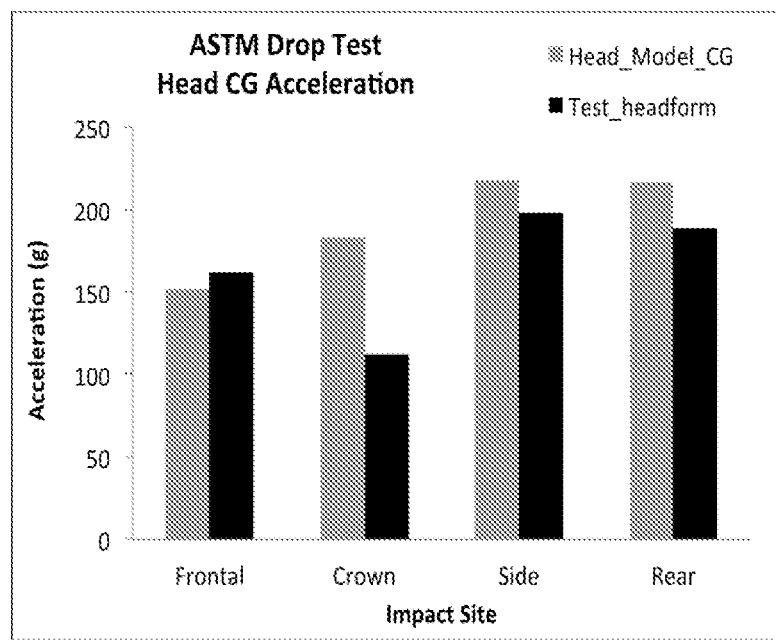
FIG. 8 is a graph illustrating head acceleration for a standard helmet drop test relative to head acceleration calculated by an FE model according to one embodiment of the present disclosure.

FIG. 8 is a graph illustrating head acceleration for a standard helmet drop test relative to head acceleration calculated by an FE model according to one embodiment of the present disclosure. FIG. 8 depicts the comparison between the standard American Society of Testing and Materials (ASTM) helmet/headform drop test and an integrated head/helmet model according to various embodiments of the present disclosure. Tests were conducted in the laboratory at a drop height of 60 inches (152.4 cm), which created an impact velocity of 5.47 m/s. Four distinct impact locations were tested including: frontal, crown, side and rear. Resultant linear accelerations at the center of gravity (CG) of the head were compared between the integrated helmeted head FE model and the experimental data measured using an instrumented headform for each impact site.

Figure 9:
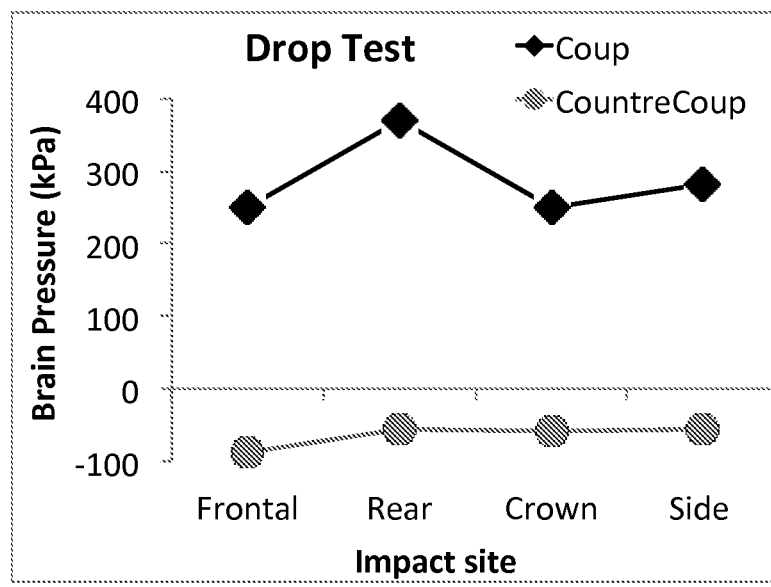
FIG. 9 is a graph illustrating peak brain pressure as calculated by an FE model for standard helmet drop test conditions according to one embodiment of the present disclosure.

FIG. 9 is a graph illustrating peak intracranial pressure as calculated by an FE model for standard helmet drop test conditions according to one embodiment of the present disclosure. Intracranial pressures were determined using the integrated helmeted head FE model at both the coup (impact site) and countrecoup (directly opposite impact site) locations. Peak brain pressures within the coup region were calculated to be above 200 kPa for the frontal, rear, crown and side impact locations. Peak negative pressures were measured between magnitudes of 0 and −100 kPa within the countrecoup region for similar impact locations. This information was compared to previously published cadaveric information to validate the model.

Figure 10:
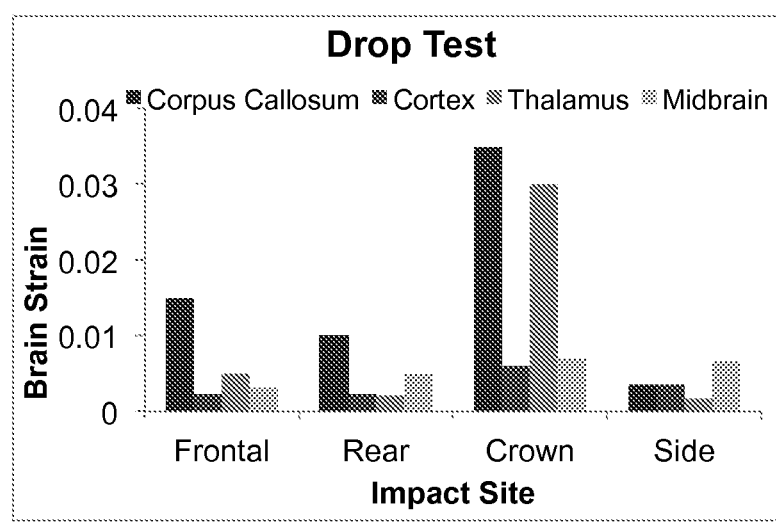
FIG. 10 is a graph illustrating brain strain as calculated by an FE model for standard helmet drop test conditions according to one embodiment of the present disclosure.

FIG. 10 is a graph illustrating brain strain as calculated by an FE model for standard helmet drop test conditions according to one embodiment of the present disclosure. Brain strain for specific areas of the brain corresponding to the corpus callosum, cortex, thalamus, and midbrain as determined by the FE model are plotted for each of the distinct impact sites: frontal, rear, crown and side. Strain was determined for each of these regions with values all less than 350 microstrains as shown in FIG. 10. The highest strain levels were produced in the corpus callosum in comparison to the other regions for all impact locations except the side impact where the midbrain sustained the highest level of strain. This information may be used within the helmet design methodology to select and evaluate different padding material properties or padding retention mechanisms to reduce probability of TBI for a particular impact, such as a side impact, for example.

Figure 11A:
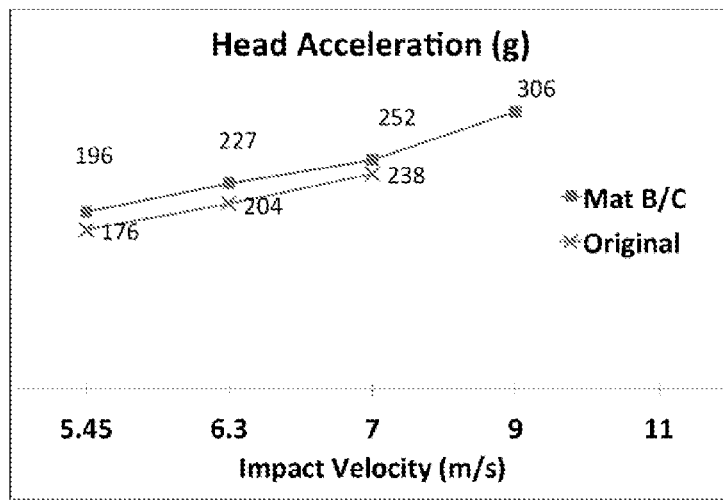
FIGS. 11A-11C illustrate use of an FE model to select, tune, or evaluate helmet cushion or padding material properties with respect to possible TBI predictors according to embodiments of the present disclosure.
Figure 11B:
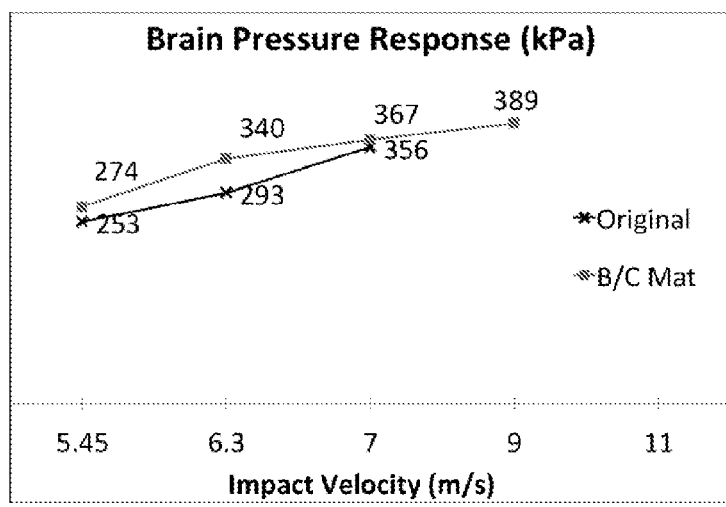
Figure 11C:
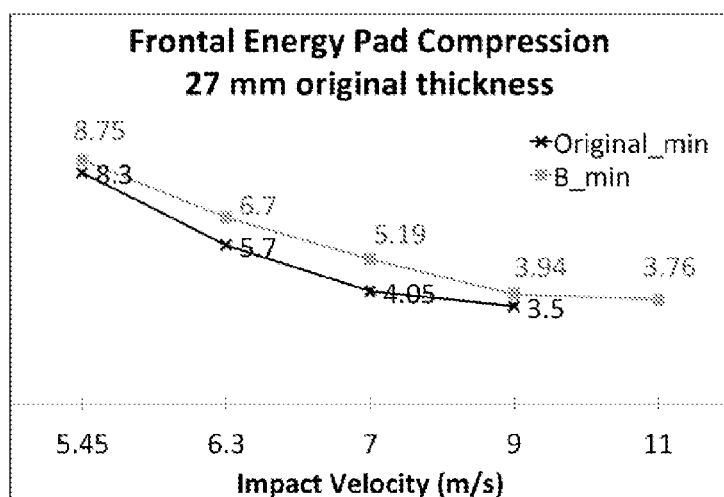

FIGS. 11A-11C illustrate use of an integrated helmet-head FE model to select, tune, or evaluate helmet cushion or padding material properties with respect to one or more TBI predictors according to embodiments of the present disclosure. Loading conditions were selected to simulate increasing impact velocities to determine the effect of different material properties relative to a baseline (original) padding material. By using the FE model according to various embodiments of the present disclosure, it was determined that the representative padding material, labeled B/C in FIG. 11A created higher accelerations at the CG of the head in comparison to the original padding material. However, this new material prevented complete compression of the material and associated bottoming out of the head against the shell at higher velocities. FIG. 11B shows that the alternative B/C material produced intracranial pressures in the brain that were only slightly above the original material, even at increasing impact velocities. Compression of the materials at the varying impact velocities is illustrated in the graph of FIG. 11C. As shown in this figure, the alternative B/C padding material had less compression at each of the associated impact velocities relative to the original material. Both the original material and the alternative B/C material were modeled for a frontal pad having an uncompressed thickness of 27 mm.

Figure 12:
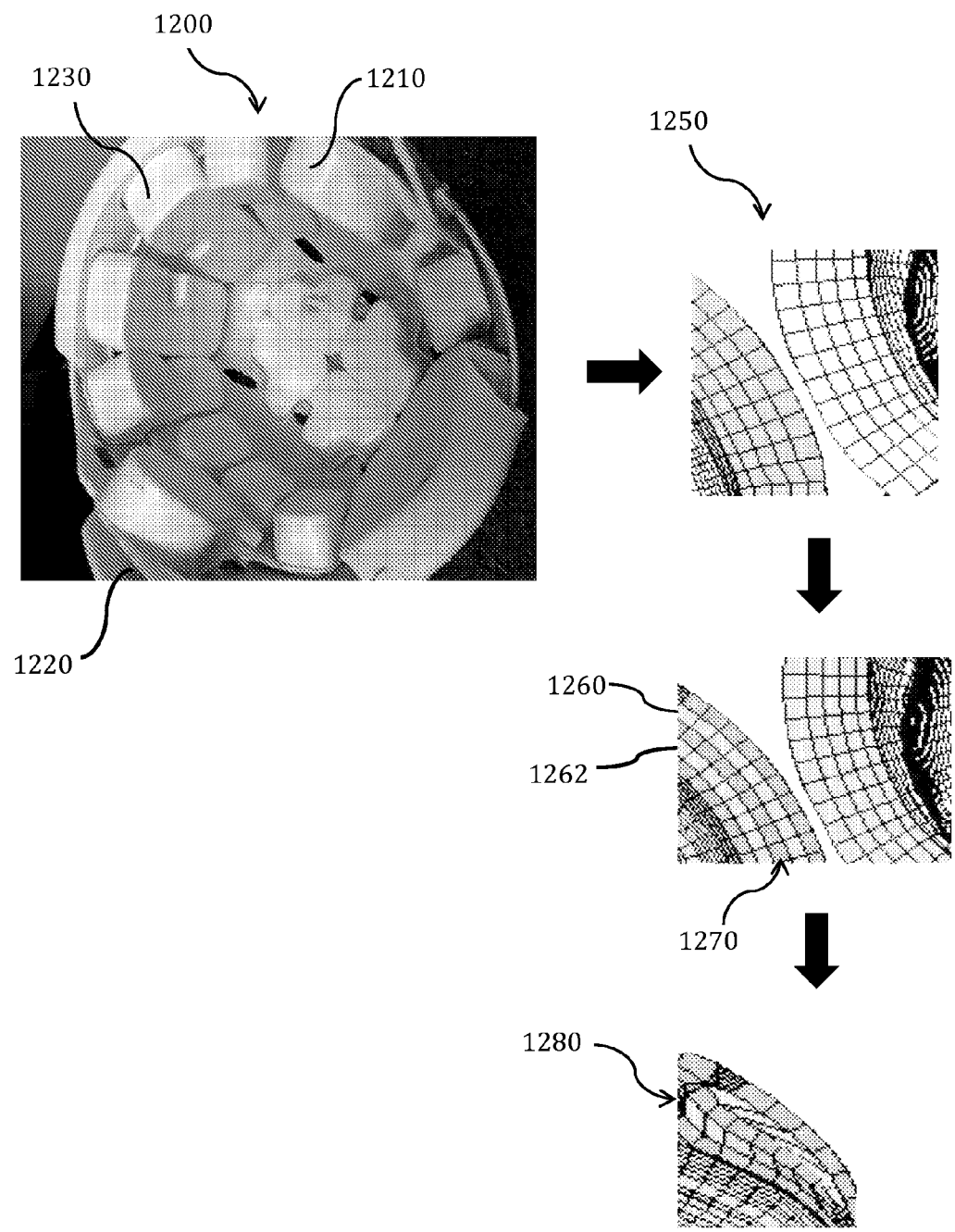
FIG. 12 is a graphical illustration of a process or method for helmet design using a computer-implemented FE model to select and evaluate helmet frontal pad materials with respect to various TBI predictors according to embodiments of the present disclosure.

FIG. 12 is a graphical illustration of a process or method for helmet design using a computer-implemented FE model to select and evaluate helmet frontal pad materials with respect to various TBI predictors according to embodiments of the present disclosure. In this representative example, football helmet 1200 includes a number of pads 1210 that can each be meshed and modeled with different material properties as well as different retention mechanisms to position and hold the pads 1210 within shell 1220. The integrated FE model is used to calculate values for selected TBI indicators for a variety of impact scenarios. In the graphical illustration of FIG. 12, a frontal pad 1230 with baseline material properties is meshed and modeled for a helmet-to-helmet impact as represented at 1250 during a variety of different types of impacts, which may include those used in standards testing as well as impacts likely to occur during use of the helmet. The original padding material of molded Vinyl Nitrile (0.8" (2.0 cm) thick) was modeled and simulated in a helmet-to-helmet impact. The original meshing was modified to evaluate a new pad design having one or more layers 1260, 1262 of viscoelastic material sandwiched between the Vinyl Nitrile layers 1270. The viscoelastic layer was assigned different material properties for comparison testing using a low shear modulus relative to the original material. Similarly, materials having non-linear shear characteristics with a shear relaxation modulus having a slow decay constant were compared to materials having a shear relaxation modulus with a faster decay constant to evaluate the TBI indicators and probability of injury. Impacts at various locations were simulated to produce more off-center or oblique loading and increase rotational motion to the head to evaluate the corresponding response of the viscoelastic shearing material as generally represented at 1280. This viscoelastic material provided additional shearing deformation and reduced TBI indicators including pressure, strain and acceleration.

Figure 13A:
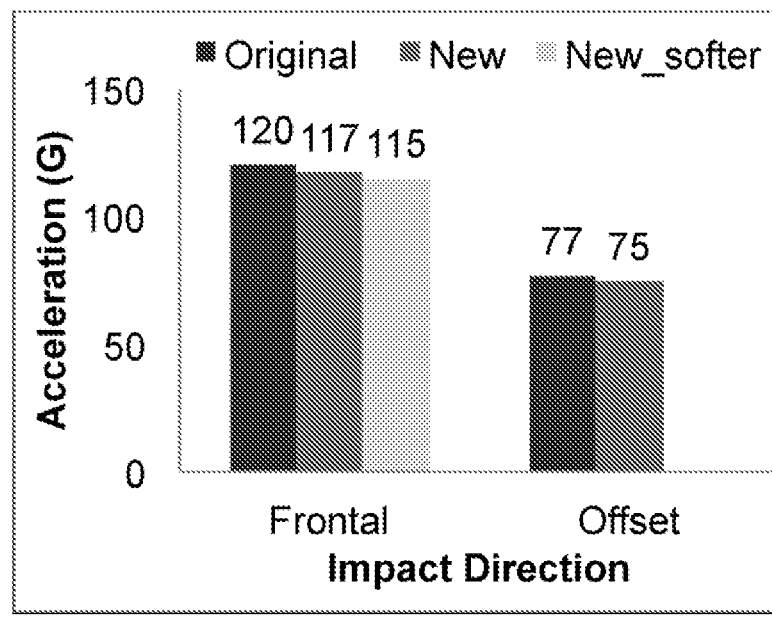
FIGS. 13A-F are graphs illustrating head translational acceleration and head injury criterion (HIC) for different impact conditions and material properties as determined by a fine mesh FE model of a helmeted head according to embodiments of the present disclosure.
Figure 13:
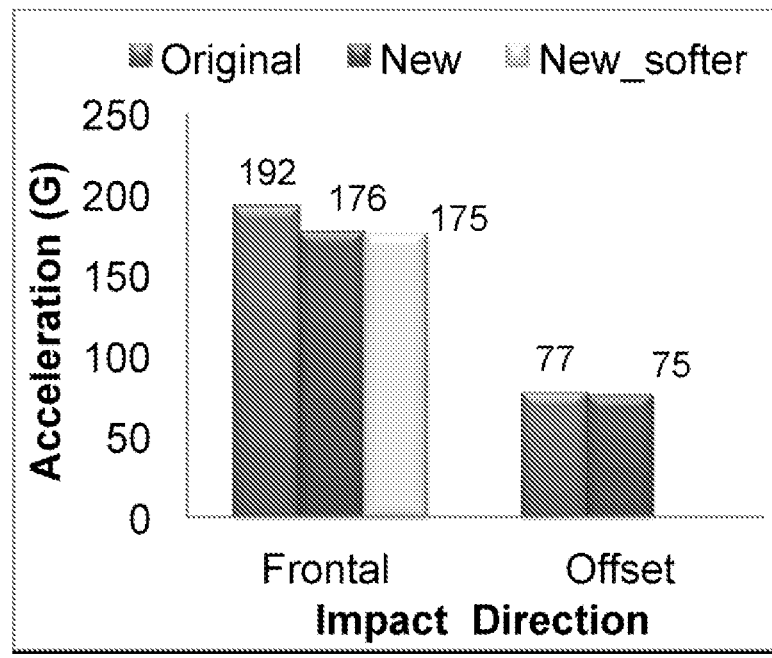
Figure 13C:
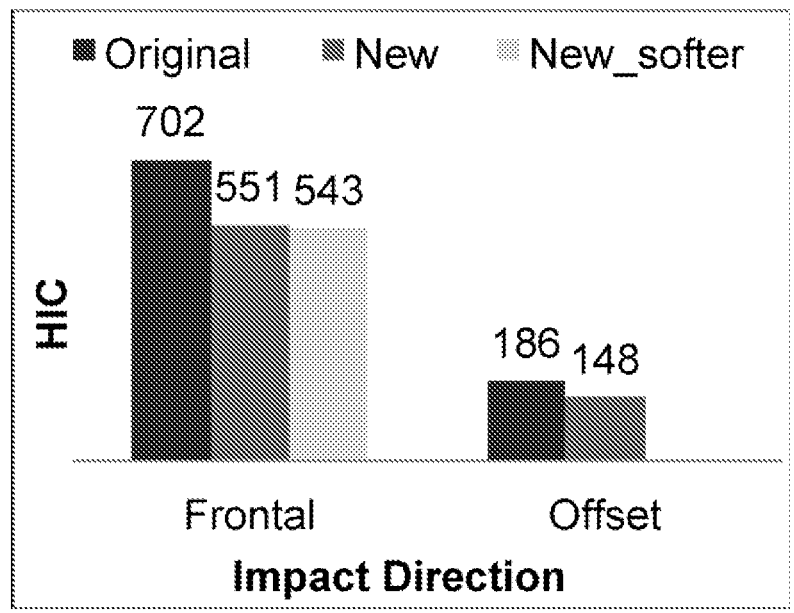
Figure 13D:
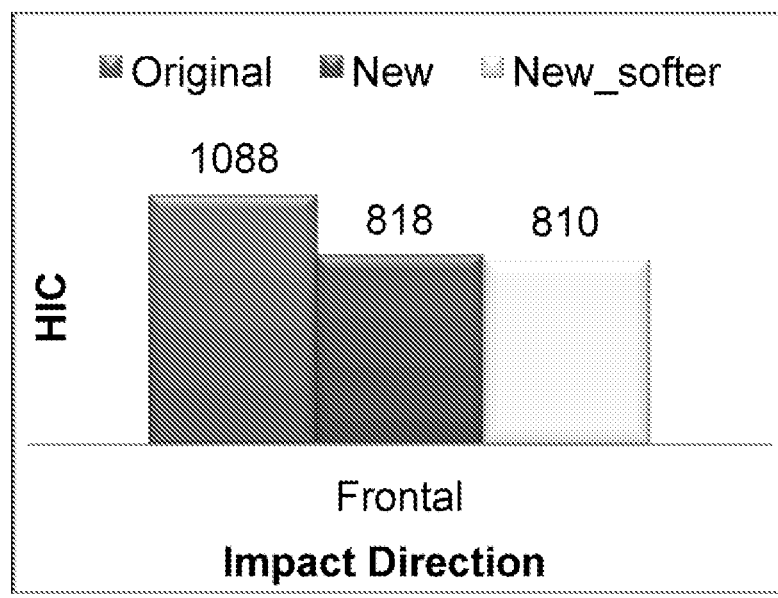

FIGS. 13A-F are graphs illustrating head translational acceleration and head injury criterion (HIC) and associated probability of injury for different impact conditions and material properties as determined by a fine mesh FE model of a helmeted head according to embodiments of the present disclosure. Both frontal and offset impacts were modeled to generate translational and rotational acceleration. Three materials were modeled including an original baseline material, a first alternative (new) and a second alternative (new-softer) material. FIG. 13A and FIG. 13B show a comparison of the resultant head acceleration for these materials at impact speeds of 7 m/s and 9 m/s, respectively, for frontal and offset impacts. HIC values are presented in FIG. 13C and FIG. 13D for the three materials. The highest reduction (23%) in HIC was seen in the frontal impact between the new_softer and the original baseline material.

Figure 13E:
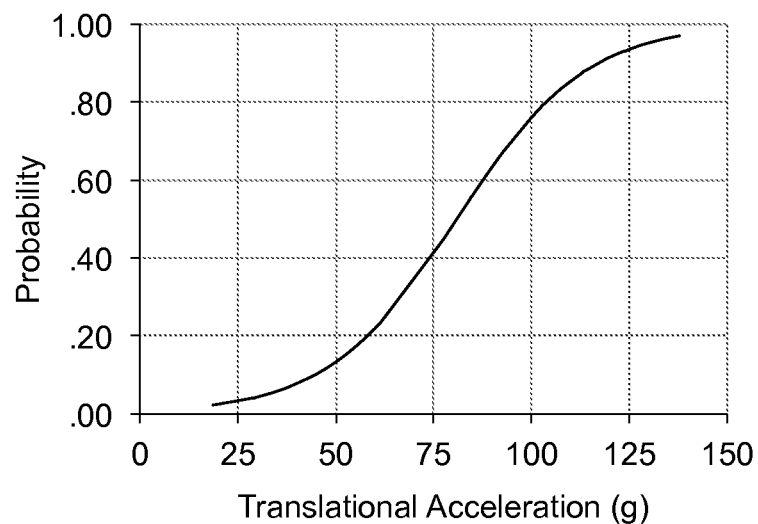
Figure 13F:
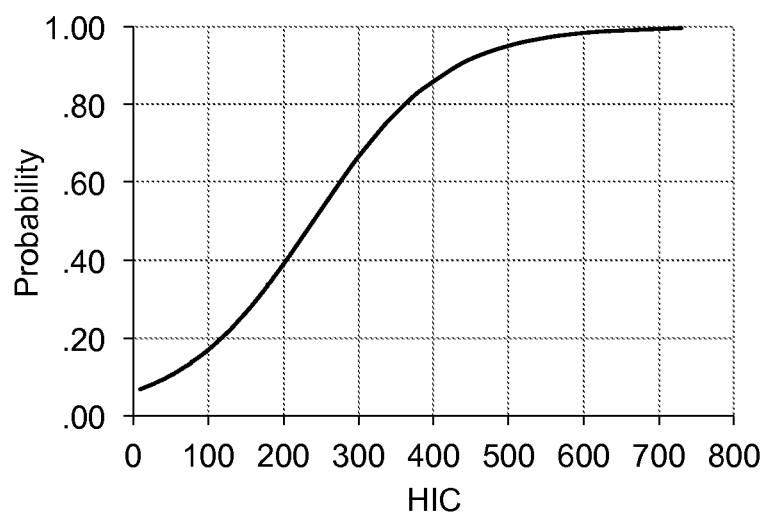

Injury risk curves were developed based on the model results as seen in FIG. 13E and FIG. 13F. The 25% probability of injury based on translational acceleration was found to be 65 g's. Values for 50% and 90% probability were 81 and 119 g's, respectively. The 25% probability of injury based on HIC was found to be 140. Values for 50% and 90% probability were 240 and 430, respectively.

Figure 14A:
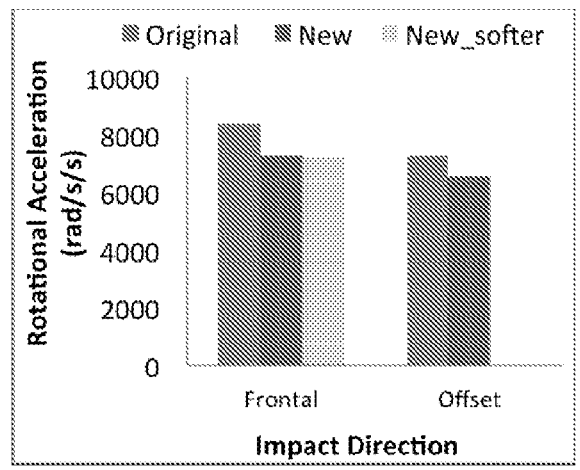
FIGS. 14A-D are graphs illustrating head rotational acceleration for different impact conditions and material properties as determined by a fine mesh FE model of a helmeted head according to embodiments of the present disclosure.
Figure 14B:
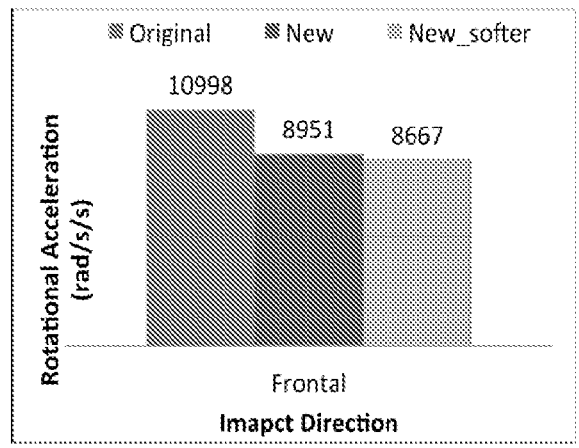
Figure 14C:
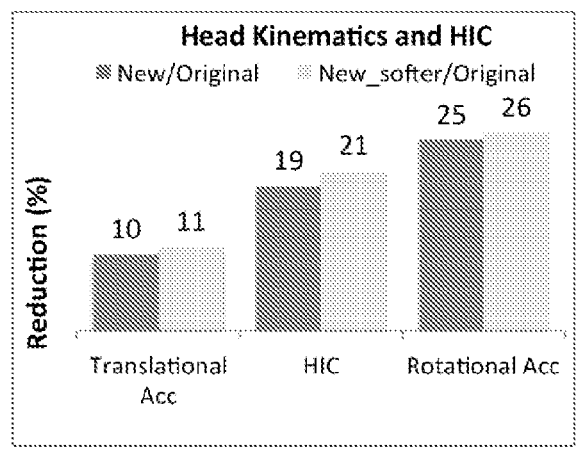

FIGS. 14A-D are graphs illustrating head rotational acceleration for different impact conditions and material properties as determined by a fine mesh FE model of a helmeted head according to embodiments of the present disclosure. FIG. 14A and FIG. 14B show the rotational acceleration results from the model for both frontal and offset impacts. Three materials were modeled as previously described and designated original, new, and new_softer. A 14% reduction was seen in the rotational acceleration when comparing both the new and new_softer to the original at an impact speed of 7 m/s. At 9 m/s, the highest reduction in rotational acceleration was seen between the new_softer and the original material as illustrated in FIG. 14C.

Figure 14D:
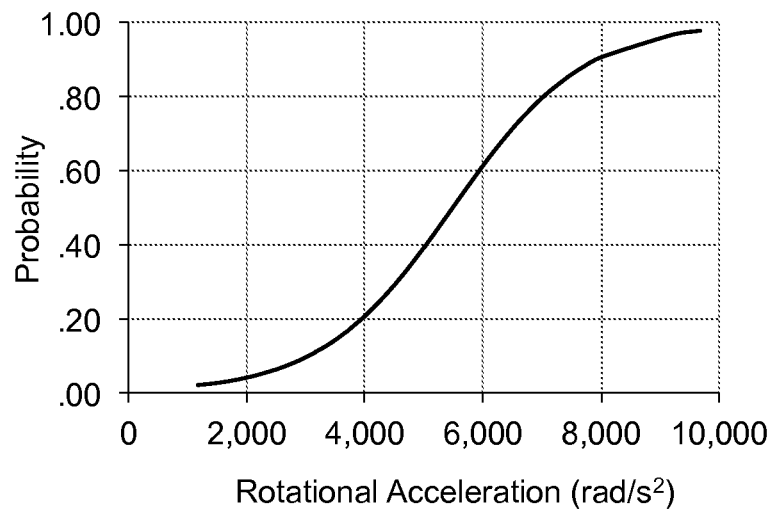

Injury risk curves were developed for rotational acceleration as seen in FIG. 14D. A 25% risk of injury was predicted at a rotational acceleration of 4400 rad/s/s. Values for 50% and 90% probability were 5600 rad/s/s and 8050 rad/s/s, respectively.

Figure 15A:
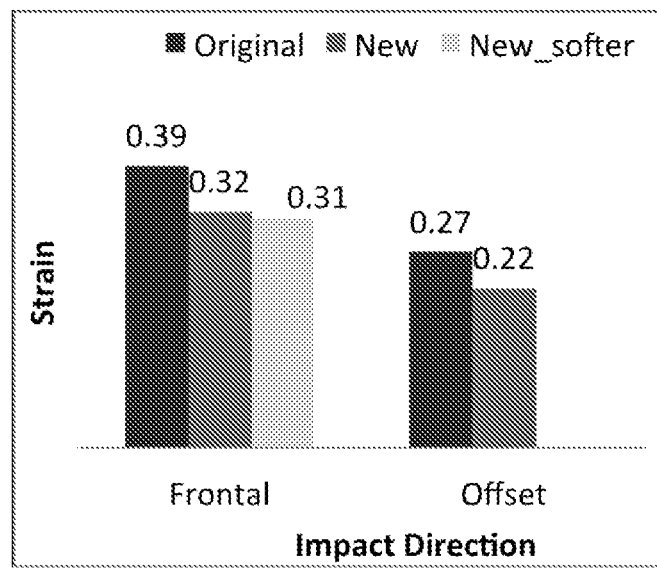
FIGS. 15A-E are graphs illustrating averaged brain strain response at four major brain structures for different impact conditions and material properties as determined by a fine mesh FE model of a helmeted head according to embodiments of the present disclosure.
Figure 15B:
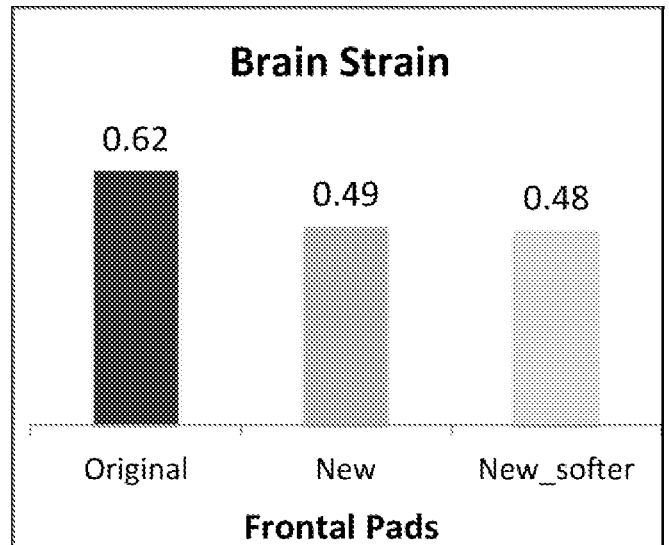
Figure 15C:
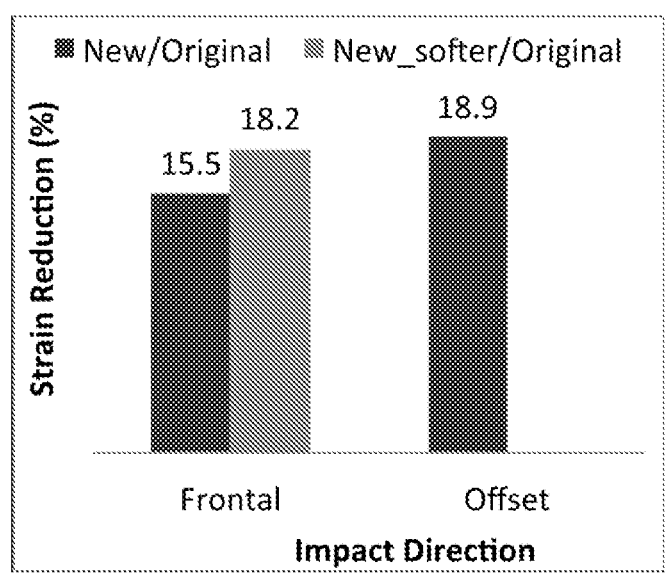
Figure 15D:
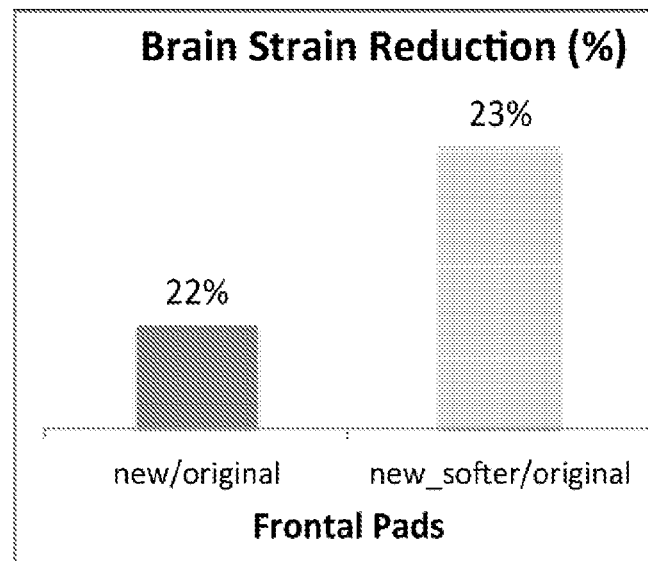

FIGS. 15A-E are graphs illustrating averaged brain strain response at four major brain structures for different impact conditions and material properties as determined by a fine mesh FE model of a helmeted head according to embodiments of the present disclosure. The averaged strain response was determined for the cerebral cortex, corpus callosum, thalamus, and midbrain/brainstem. FIG. 15A and FIG. 15B demonstrate the effect of the varying materials on strain values predicted by the model at impact speeds of 7 m/s and 9 m/s. At 7 m/s the model predicted >25% probability of injury with the original padding material in comparison to the new padding material where <25% probability of injury was predicted. A reduction from 15-18% was noted for frontal and offset impacts at 7 m/s as seen in FIG. 15C. FIG. 15D shows a 22-23% reduction in brain strain with the new and new_softer material in comparison to the original material at an impact speed of 9 m/s.

Figure 15E:
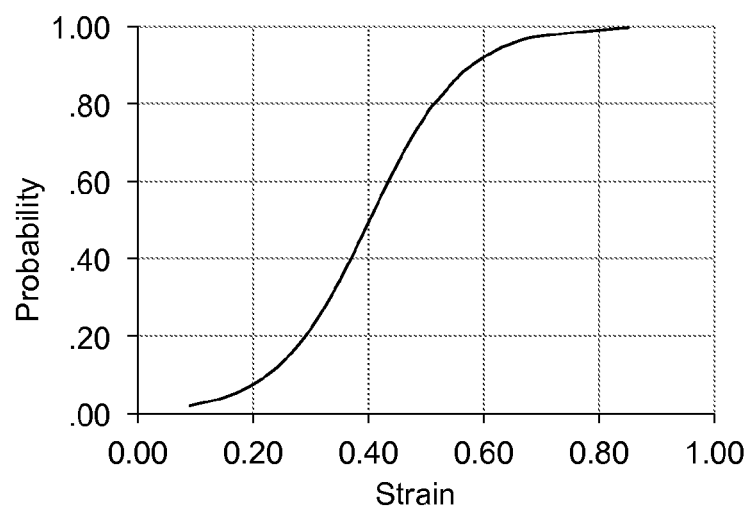

An injury risk curve is presented in FIG. 15E where a 25% probability of injury is predicted with 0.30 strain. Values for strain at both 50% and 90% were predicted at 0.40 and 0.58, respectively.

Figure 16A:
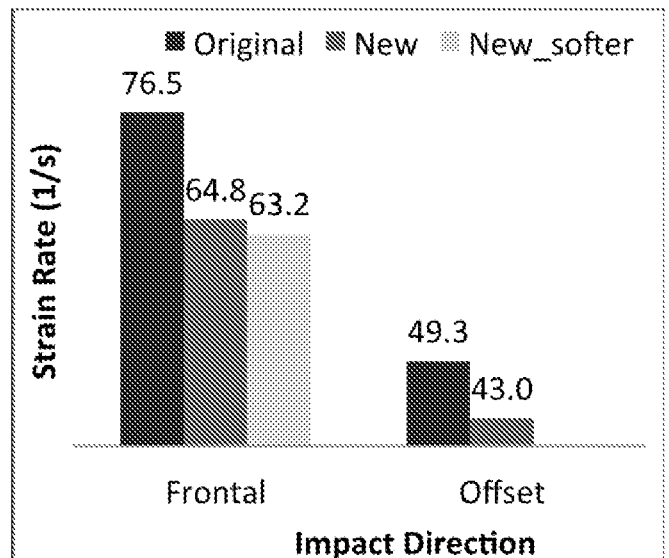
FIGS. 16A-E are graphs illustrating averaged brain strain rate response of four major brain structures for different impact conditions and material properties as determined by a fine mesh FE model of a helmeted head according to embodiments of the present disclosure.
Figure 16B:
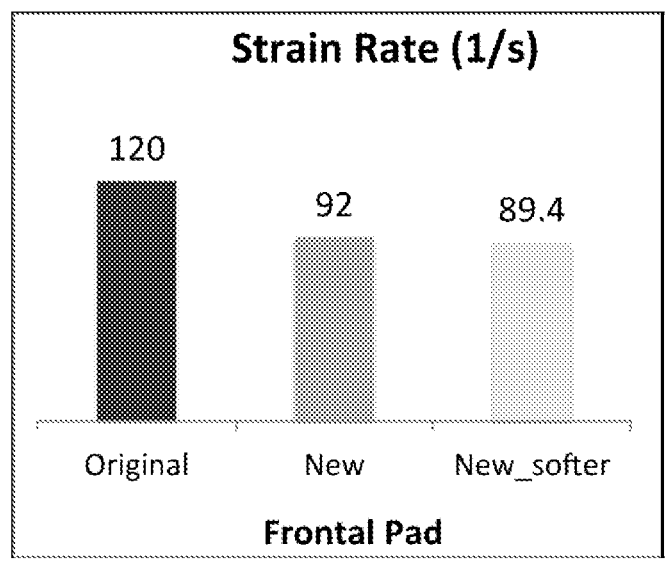
Figure 16C:
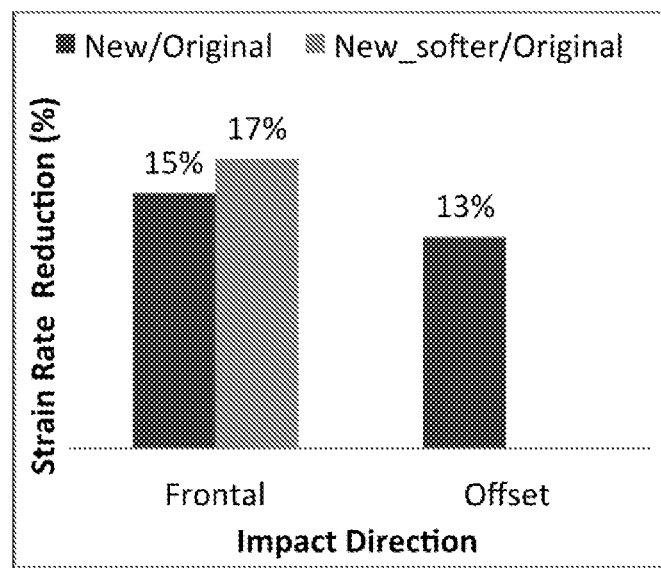
Figure 16D:
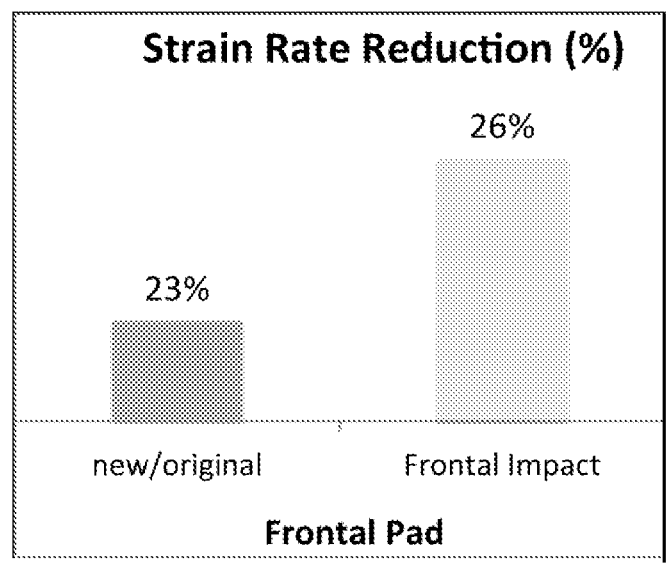

Similar to the results illustrated in FIG. 15, FIGS. 16A-E are graphs illustrating averaged brain strain rate response of four major brain structures for different impact conditions and material properties as determined by a fine mesh FE model of a helmeted head according to embodiments of the present disclosure. FIG. 16A and FIG. 16B demonstrate the effect of the varying materials on strain rate values predicted by the model at impact speeds of 7 m/s and 9 m/s. At 7 m/s the model predicted >50% probability of injury with the original pad in comparison to the new pad where <25% probability of injury was predicted. A reduction from 13-17% was noted for frontal and offset impacts at 7 m/s as seen in FIG. 16C. FIG. 16D shows a 23-26% reduction in brain strain with the new and new_softer material in comparison to the original padding material at an impact speed of 9 m/s.

Figure 16E:
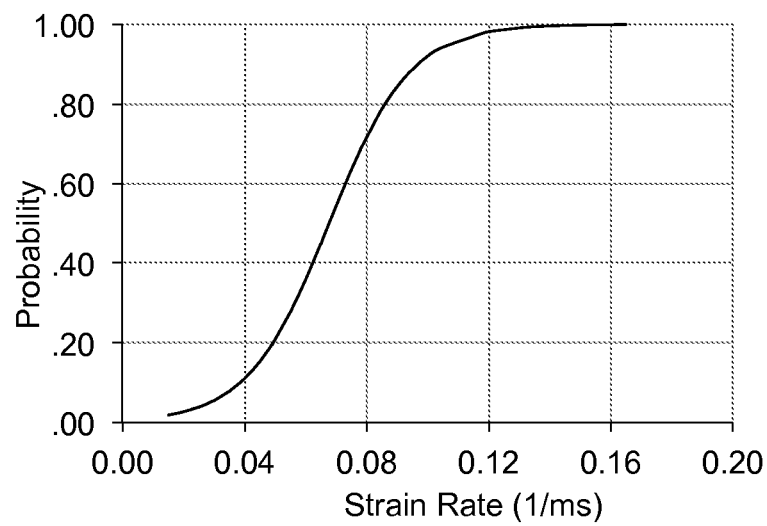

An injury risk curve is presented in FIG. 16E where a 25% probability of injury is predicted with a strain rate of 54 (l/s). Values for strain rates at both 50% and 90% were predicted at 68 (l/s) and 98 (l/s), respectively.

Figure 17A:
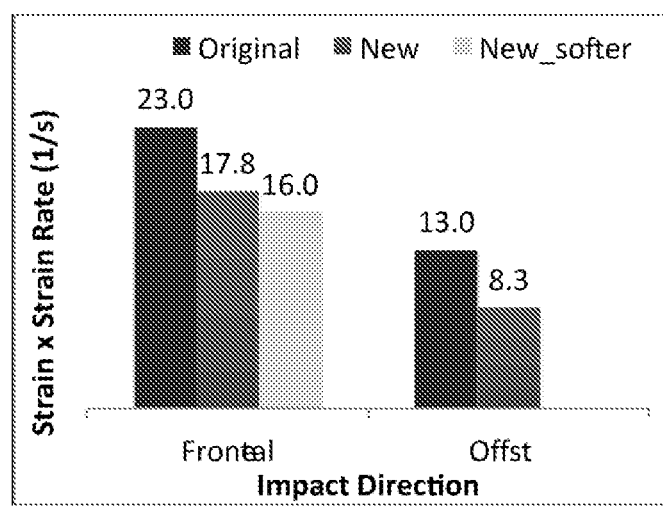
FIGS. 17A-E are graphs illustrating the product of brain strain and brain strain rate as a predictor for MTBI for different impact conditions and material properties as determined by a fine mesh FE model of a helmeted head according to embodiments of the present disclosure.
Figure 17B:
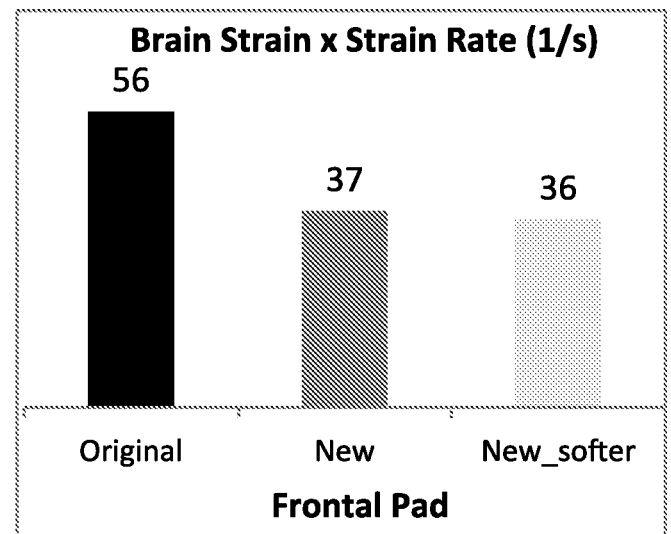
Figure 17C:
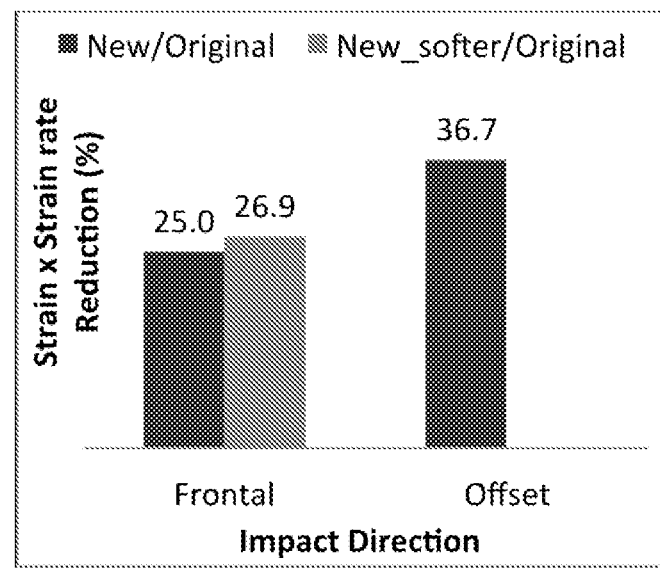
Figure 17D:
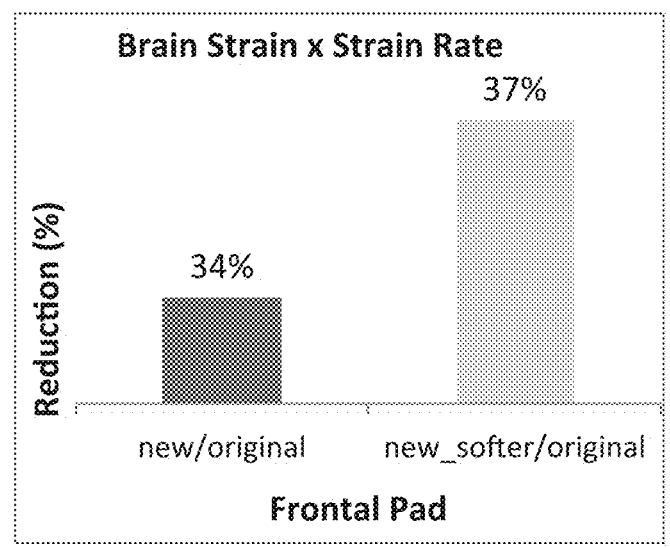

FIGS. 17A-E are graphs illustrating the product of brain strain and brain strain rate as a predictor for TBI for different impact conditions and material properties as determined by a fine mesh FE model of a helmeted head according to embodiments of the present disclosure. FIG. 17A and FIG. 17B demonstrate the effect of the varying materials on the product of strain and strain rate as determined by the model at impact speeds of 7 m/s and 9 m/s. At an impact speed of 7 m/s the model predicted >50% probability of injury with the original padding material in comparison to the new padding material where <25% probability of injury was predicted. At 9 m/s, the original padding had a 100% probability of injury with the new pad having 90% probability of injury. A reduction of between about 25-36.7% was noted for frontal and offset impacts at an impact speed of 7 m/s as illustrated in FIG. 17C. FIG. 17D shows a 34-37% reduction in brain strain with the new and new_softer padding material in comparison to the original padding material at an impact speed of 9 m/s.

Figure 17E:
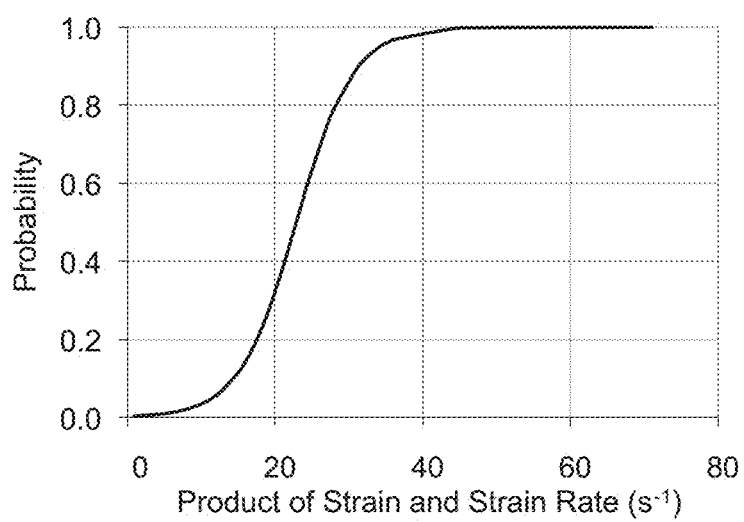

An injury risk curve is presented in FIG. 17E where a 25% probability of injury is predicted with the product of strain times strain rate being 18 (l/s). Values for the product of strain times strain rate at both 50% and 90% were predicted at 23 (l/s) and 34 (l/s), respectively.

As illustrated and described with respect to FIGS. 1-17, the present disclosure provides a system and method for designing a helmet having various advantages over previous designs because it is designed to prevent concussion rather than only preventing skull fracture. By tuning the helmet shell and padding or cushion material using a finite element computer model of the head, brain, and helmet to reduce the pressure, strain and/or strain rate experienced by the brain during a particular impact according to embodiments of the present disclosure, mild traumatic brain injury can be reduced or prevented. Use of an integrated head, brain, and helmet FE model based on the Wayne State University Head Injury Model developed by Zhang et al (2001) or any similar model with a fine mesh that has been validated against available experimental data should facilitate helmets that reduce the probability of a concussion for a particular impact by selecting helmet materials and design characteristics to limit one or more TBI indicators, such as pressure, strain and strain rate, experienced by the brain below corresponding thresholds that are likely to result in a concussion or other designated TBI. Providing associated testing input parameters to assess various types of helmet cushion and shell materials with respect to reducing brain strain and strain rate and resulting mild traumatic brain injury facilitates evaluation and comparison of various types of helmet materials and designs.

While the best mode has been described in detail, those familiar with the art will recognize various alternative designs and embodiments within the scope of the following claims. While various embodiments may have been described as providing advantages or being preferred over other embodiments with respect to one or more desired characteristics, as one skilled in the art is aware, one or more characteristics may be compromised to achieve desired system attributes, which depend on the specific application and implementation. These attributes include, but are not limited to: cost, strength, durability, life cycle cost, marketability, appearance, packaging, size, serviceability, weight, manufacturability, ease of assembly, etc. The embodiments discussed herein that are described as less desirable than other embodiments or prior art implementations with respect to one or more characteristics are not outside the scope of the disclosure and may be desirable for particular applications.

What is claimed is:
1. A method for designing a helmet to reduce mild traumatic brain injury sustained by a user during primary or secondary head impact, the method comprising:
modeling a head, brain, and helmet using a finite element computer model, the finite element computer model including material properties for the head, brain and helmet and estimating at least intracranial pressure, brain strain and strain rate in response to an impact; and selecting at least one of a helmet cushion material and helmet shell material to limit at least one of the brain strain and strain rate to a corresponding threshold for an associated impact.

2. The method of claim 1 further comprising selecting a corresponding threshold for brain strain by identifying brain strain using the model that would result in a mild traumatic brain injury to the user.

3. The method of claim 1 further comprising:

determining extent of brain injury based on computed pressures, strains and strain rates at a plurality of locations of the brain model; and assigning a risk of concussion based on the computed pressures, strains and strain rates.

4. The method of claim 3 further comprising:

computing head linear and angular accelerations associated with the computed pressures, strains and strain rates.

5. The method of claim 1 further comprising selecting a helmet cushion material having a stiffness exhibiting a non-linear response to reduce the possibility of a user's head from bottoming out against the helmet shell in response to an impact having designated characteristic.

6. The method of claim 1 wherein selecting comprises selecting a helmet cushion material that reduces angular acceleration of the brain during impact.

7. The method of claim 1 further comprising determining measurable input parameters for testing of helmets based on the finite element computer model of the head and brain.

8. The method of claim 7 wherein the measurable input parameters include angular acceleration and linear acceleration.

9. A system for designing a helmet to reduce mild traumatic brain injury sustained by a user during primary or secondary head impact, the system comprising:

a computer having a processor;

a non-transitory storage medium in communication with the computer and having a finite element computer model executable by the computer to predict mild traumatic brain injury associated with a designated head impact of a user wearing a helmet, the finite element model representing a head, brain, and the helmet each having associated material properties, the finite element model estimating at least intracranial pressure, brain strain and strain rate in response to the designated head impact.

10. The system of claim 9 wherein the storage medium includes code for determining testing parameters associated with at least intracranial pressure, brain strain and strain rate.

11. The system of claim 10 wherein the testing parameters include angular acceleration.

12. The system of claim 9 wherein the non-transitory storage medium includes a finite element model that includes a mesh for calculating at least one of intracranial pressure, brain strain and strain rate for a plurality of brain structures.

13. The system of claim 12 wherein the plurality of brain structures comprises a cerebral cortex, corpus callosum, thalamus, and midbrain.

14. The system of claim 13 wherein the system calculates a product of the brain strain and strain rate for the plurality of brain structures and determines a probability of mild traumatic brain injury for a designated impact based on the product.

15. A computer-implemented method comprising:

modeling a helmeted head using a finite element computer model including models of at least a plurality of individual brain structures, a helmet shell, and helmet padding; and calculating at least one MTBI indicator value for a designated impact to the helmeted head using the finite element computer model including the models of the plurality of individual brain structures.

16. The method of claim 15 wherein the plurality of individual brain structures comprises a cerebral cortex, a corpus callosum, a thalamus, and a midbrain.

17. The method of claim 15 wherein the at least one MTBI indicator comprises intracranial pressure, brain strain and brain strain rate.

18. The method of claim 15 wherein the at least one MTBI indicator comprises a product of brain strain and brain strain rate for the plurality of brain structures.

19. The method of claim 15 wherein modeling a helmeted head comprises modeling helmet padding having a multi-layer padding with a non-linear shear characteristic.

\* \* \* \* \*